US011377730B2

(12) United States Patent
Takagi et al.

(10) Patent No.: US 11,377,730 B2
(45) Date of Patent: Jul. 5, 2022

(54) SUBSTRATE PROCESSING APPARATUS AND FURNACE OPENING COVER

(71) Applicant: KOKUSAI ELECTRIC CORPORATION, Tokyo (JP)

(72) Inventors: Kosuke Takagi, Toyama (JP); Shinya Morita, Toyama (JP); Naonori Akae, Toyama (JP); Keishin Yamazaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 75 days.

(21) Appl. No.: 16/136,496

(22) Filed: Sep. 20, 2018

(65) Prior Publication Data

US 2019/0017168 A1    Jan. 17, 2019

Related U.S. Application Data

(62) Division of application No. 15/128,139, filed as application No. PCT/JP2015/054138 on Feb. 16, 2015, now abandoned.

(30) Foreign Application Priority Data

Mar. 26, 2014   (JP) .............................. JP2014-063073

(51) Int. Cl.
  *C23C 16/44*  (2006.01)
  *H01L 21/67*  (2006.01)
  *H01J 37/32*  (2006.01)
(52) U.S. Cl.
  CPC ...... *C23C 16/4401* (2013.01); *C23C 16/4409* (2013.01); *H01J 37/32513* (2013.01); *H01L 21/67109* (2013.01); *H01L 21/67126* (2013.01)

(58) Field of Classification Search
  CPC ............ C23C 16/4401; C23C 16/4404; C23C 16/4408; C23C 16/4409; C23C 16/4558;
  (Continued)

(56) References Cited

U.S. PATENT DOCUMENTS 5,468,298 A * 11/1995 Lei .......................... C23C 16/04
                                                         118/715
5,574,247 A * 11/1996 Nishitani ............ C23C 16/0245
                                                         118/708
(Continued)

FOREIGN PATENT DOCUMENTS

| JP | 2000-058459 A | 2/2000 |
| JP | 2002-353145 A | 12/2002 |
| JP | 2009-099608 A | 5/2009 |

*Primary Examiner* — Benjamin Kendall
(74) *Attorney, Agent, or Firm* — Volpe Koenig

(57) ABSTRACT

Provided is a technique capable of suppressing the occurrence of by-products by suppressing adhesion of the by-products. A substrate processing apparatus includes: a reaction tube where a substrate is processed; a furnace opening unit disposed at a lower end of the reaction tube and having an upper surface and an inner circumferential surface, the furnace opening unit including: a concave portion disposed on the upper surface; and a convex portion having at least one notch connecting the concave portion to the inner circumferential surface; a cover covering at least the inner circumferential surface with a predetermined gap therebetween; and a gas supply unit configured to supply a gas to the concave portion.

7 Claims, 13 Drawing Sheets

(58) Field of Classification Search
CPC .............. C23C 16/481; H01J 37/32477; H01J 37/32495; H01J 37/32513; H01J 37/32853; H01J 37/32871; H01L 21/67109; H01L 21/67115; H01L 21/67126; H01L 21/67303
See application file for complete search history.

(56) References Cited

U.S. PATENT DOCUMENTS

| | | | |
|---|---|---|---|
| 5,968,593 A | 10/1999 | Sakamoto et al. | |
| 6,110,286 A * | 8/2000 | Oh | C23C 16/4401 118/500 |
| 6,408,786 B1 * | 6/2002 | Kennedy | C23C 16/4404 118/723 AN |
| 7,234,412 B2 * | 6/2007 | Carpenter | C23C 16/4401 118/723 R |
| 8,282,768 B1 | 10/2012 | Smargiassi et al. | |
| 9,653,267 B2 * | 5/2017 | Carducci | H01J 37/32495 |
| 2003/0015138 A1 * | 1/2003 | Tometsuka | C23C 16/4401 118/715 |
| 2004/0043228 A1 * | 3/2004 | Derderian | C23C 16/08 428/446 |
| 2004/0134427 A1 * | 7/2004 | Derderian | C23C 16/4404 118/715 |
| 2008/0145810 A1 | 6/2008 | Chen et al. | |
| 2011/0198417 A1 * | 8/2011 | Detmar | H01J 37/321 239/569 |
| 2011/0303146 A1 * | 12/2011 | Nishijima | H01J 37/32412 118/708 |
| 2013/0316079 A1 * | 11/2013 | Ellrich | C23C 14/564 427/248.1 |
| 2016/0083837 A1 * | 3/2016 | Narushima | C23C 16/4408 118/725 |

* cited by examiner

SUBSTRATE PROCESSING APPARATUS AND FURNACE OPENING COVER

CROSS-REFERENCE TO RELATED PATENT APPLICATIONS

This non-provisional U.S. patent application is a division of U.S. patent application Ser. No. 15/128,139 and claims priority under 35 U.S.C. § 119 of Japanese Patent Application No. 2014-063073, filed on Mar. 26, 2014, and international Patent Application No. PCT/JP2015/054138, filed on Feb. 16, 2015, in WIPO, the entire contents of which are hereby incorporated by reference.

BACKGROUND

1. Field

The present disclosure relates to a substrate processing apparatus and a furnace opening cover.

2. Description of the Related Art

A substrate processing apparatus is known as one example of a semiconductor manufacturing apparatus. The substrate processing apparatus includes a reaction tube where substrates are housed; a gas introduction pipe for supplying a process gas into the reaction tube; a heating unit configured to heat the substrates in the reaction tube; an exhaust pipe for exhausting the inner atmosphere of the reaction tube; and a substrate retainer loaded into the reaction tube with the substrates supported therein. After the substrate retainer supporting the substrates is loaded into the reaction tube through a lower end (furnace opening) of the reaction tube, a process gas is supplied into the reaction tube through the gas introduction pipe with the substrates heated by the heating unit, thereby forming a desired film on the substrates (refer to Patent Document 1).

RELATED ART DOCUMENT

Patent Document

Patent Document 1: Japanese Patent Publication No. 2009-99608

The substrate processing apparatus described above may further include a metallic furnace opening unit installed at the lower end of the reaction tube. The gas introduction pipe may be fixed to the furnace opening unit. When by-products adhere to the inner circumference of the furnace opening unit, particles may occur.

SUMMARY

Described herein is a technique capable of suppressing the occurrence of particles.

According to one aspect described herein, a substrate processing apparatus may include: a reaction tube where a substrate is processed; a furnace opening unit disposed at a lower end of the reaction tube and having an upper surface and an inner circumferential surface, the furnace opening unit including: a concave portion disposed on the upper surface; and a convex portion having at least one notch connecting the concave portion to the inner circumferential surface; a cover covering at least the inner circumferential surface with a predetermined gap therebetween; and a gas supply unit configured to supply a gas to the concave portion.

According to the technique described herein, it is possible to suppress the occurrence of particles.

DETAILED DESCRIPTION OF THE PREFERRED EMBODIMENTS

Hereafter, a first embodiment described herein will be described with reference to the accompanying drawings.

Figure 1:
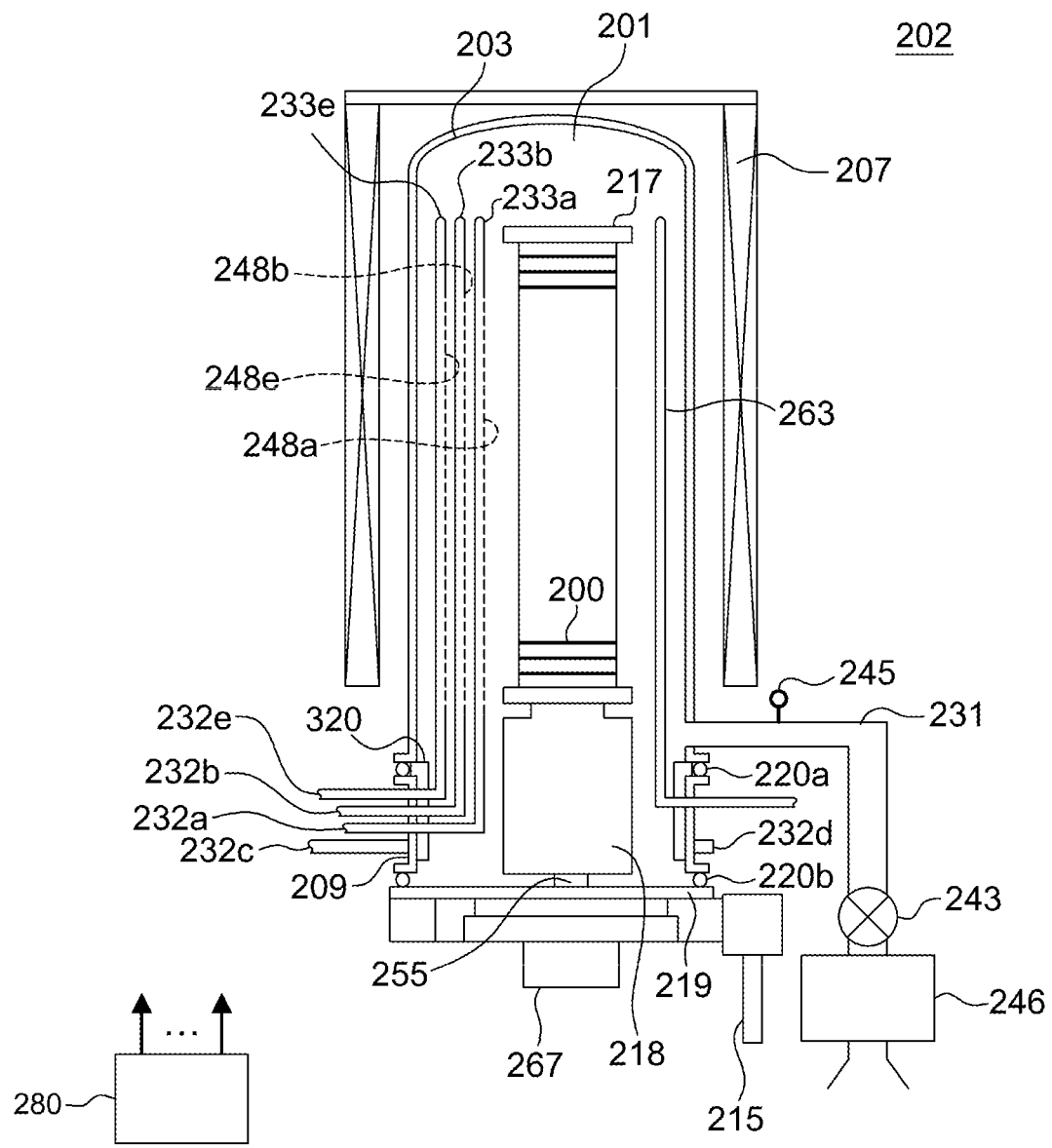
FIG. 1 schematically illustrates a substrate processing apparatus according to a first embodiment described herein.

As illustrated in FIG. 1, a process furnace 202 includes a heater 207 as a heating unit (heating device). The heater 207 has a cylindrical shape and is vertically installed while being supported by a heater base (not illustrated).

A process tube 203 serving as a reaction tube is installed in the heater 207 so as to be concentric with the heater 207. The process tube 203 is formed of a heat-resisting material such as quartz ($SiO_2$) and carbon silicon (SiC), and is cylindrical with a closed upper end and an open lower end. A process chamber 201 is disposed in a hollow inner portion of the process tube 203. The process chamber 201 may house a plurality of wafers 200 as substrates therein, the wafers 200 being horizontally laid and vertically stacked in multiple stages by a boat 217 serving as a substrate retainer.

An exhaust pipe 231 for exhausting the inner atmosphere of the process chamber 201 is installed at a lower portion of the process tube 203. A vacuum pump 246 serving as a vacuum exhauster is connected to the exhaust pipe 231 with a pressure sensor 245 and an APC (Automatic Pressure Controller) valve 243 interposed therebetween. The pressure sensor 245 serves as a pressure detector, and the APC valve 243 serves as a pressure regulator. By adjusting an opening degree of the APC valve 243 based on a pressure detected by the pressure sensor 245, the process chamber 201 may be vacuum-exhausted by the vacuum pump 246 such that the inner pressure of the process chamber 201 becomes a predetermined pressure (vacuum degree). The APC valve 243 may vacuum-exhaust the process chamber 201 through an opening/closing operation or suspend the vacuum exhaust, and adjust the inner pressure of the process chamber 201 by adjusting the opening degree.

A furnace opening unit 209 is installed at the lower end of the process tube 203 so as to be concentric with the process tube 203. The furnace opening unit 209 is also referred to as an inlet or manifold. The furnace opening unit 209 is formed of a metal such as stainless steel (SUS) or nickel (Ni) alloy, and cylindrical with an open upper end and an open lower end. A gas introduction unit described later is fixed to the furnace opening unit 209. The furnace opening unit 209 supports the process tube 203. An O-ring 220a serving as a seal member is installed between the furnace opening unit 209 and the process tube 203. The process tube 203 and the furnace opening unit 209 constitute a reaction container.

A first nozzle 233a serving as a first gas introduction unit, a second nozzle 233b serving as a second gas introduction unit, and a third nozzle 233e serving as a third gas introduction unit are installed at the furnace opening unit 209 so as to penetrate the sidewall of the furnace opening unit 209. Each of the first to third nozzles 233a, 233b and 233e is L-shaped with a horizontal portion and a vertical portion. The horizontal portions of the first to third nozzles 233a, 233b and 233e are connected to the sidewall of the furnace opening unit 209. The vertical portions of the first to third nozzles 233a, 233b and 233e are disposed in an annular space between the inner wall of the process tube 203 and the wafer 200, and extended along the inner wall of the upper portion from the lower portion of the process tube 203. First to third gas supply holes 248a, 248b and 248e for supplying gases are installed at side surfaces of the vertical portions of the first to third nozzles 233a, 233b and 233e, respectively.

A temperature sensor 263 serving as a temperature detector is installed in the process tube 203 so as to penetrate the sidewall of the furnace opening unit 209. By adjusting the amount of power supplied to the heater 207 based on temperature information detected by the temperature sensor 263, the inner temperature of the process chamber 201 becomes a predetermined temperature. The temperature sensor 263 is installed along the inner wall of the process tube 203, like the first to third nozzles 233a, 233b and 233e.

In the first embodiment described herein, a gas supply unit 232a for supplying a raw material gas and an inert gas is connected to the first nozzle 233a, and a gas supply unit 232b for supplying a reactive gas and an inert gas is connected to the second nozzle 233b. That is, in the first embodiment described herein, the raw material gas and the reactive gas are supplied through the separate nozzles. A cleaning gas supply unit 232e for supplying a cleaning gas is connected to the third nozzle 233e.

Inert gas supply units 232c and 232d for supplying an inert gas such as $N_2$ gas (nitrogen) are connected to the furnace opening unit 209.

A seal cap 219 capable of airtightly closing the opening of the lower end of the furnace opening unit 209 is installed at the lower portion of the furnace opening unit 209. The seal cap 219 is in contact with the lower end of the furnace opening unit 209 from thereunder. The seal cap 219 is formed of a metal such as stainless steal and is disk-shaped. An O-ring 220b serving as a seal member which is in contact with the lower end of the furnace opening unit 209 is installed on the upper surface of the seal cap 219. A rotating mechanism 267 for rotating the boat 217 described later is installed at the opposite surface of the surface of the seal cap 219, which is in contact with the process chamber 201. The rotating mechanism 267 has a rotating shaft 255 penetrating the seal cap 219 and connected to the boat 217. As the rotating mechanism 267 rotates the boat 217, the wafer 200 is rotated. The boat 217 and the seal cap 219 are vertically lifted/lowered by a boat elevator 215 serving as an elevating mechanism disposed outside the process tube 203. In this way, the boat 217 may be loaded into the process chamber 201 or unloaded out of the process chamber 201.

The boat 217 is formed of a material such as quartz ($SiO_2$) and silicon carbide (SiC).

An insulating member 218 formed of a heat-resisting material such as quartz ($SiO_2$) and silicon carbide (SiC) is installed under the boat 217. The insulating member 218 suppresses heat from transmitting to the seal cap 219 from the heater 207.

Figure 2:
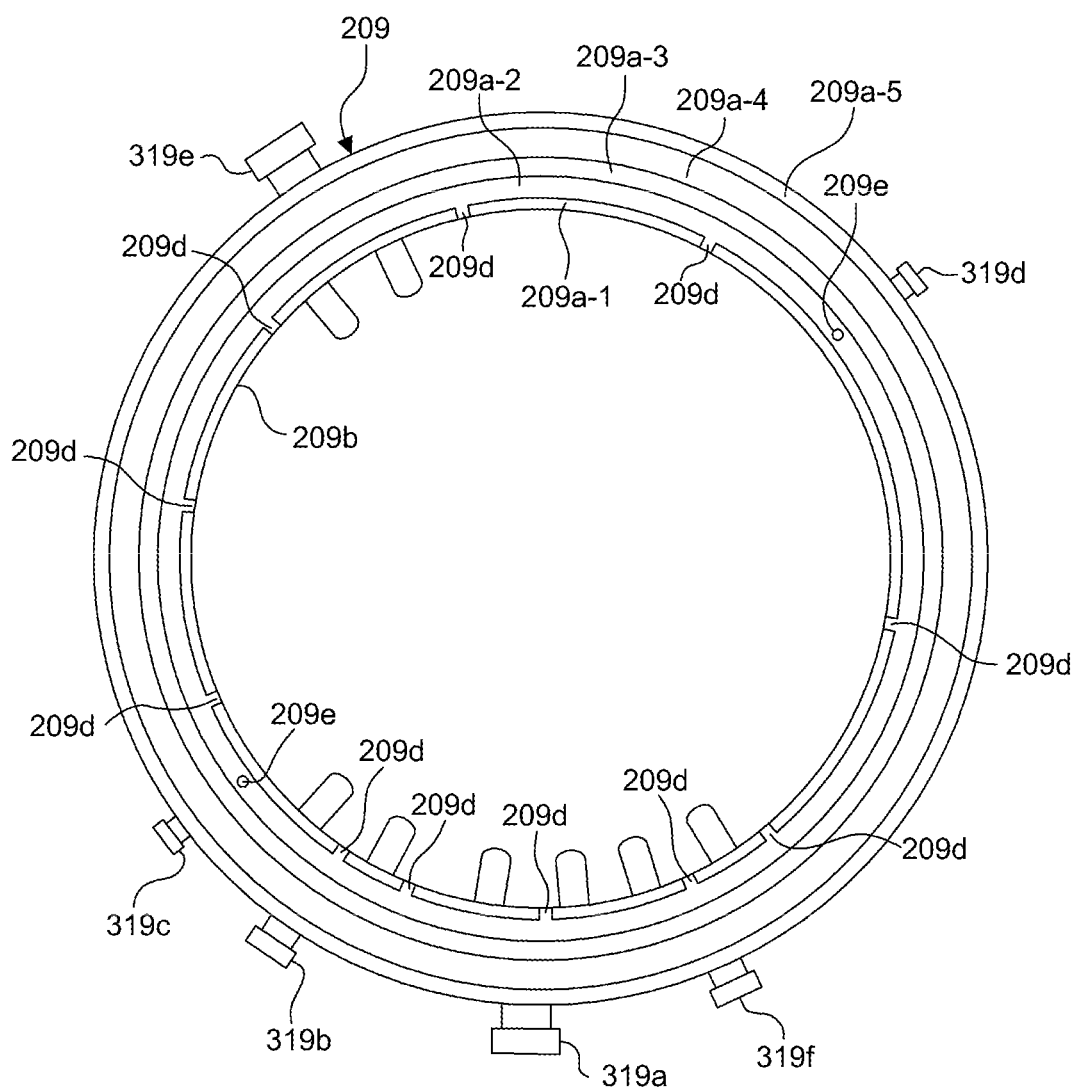
FIG. 2 is a plan view of a furnace opening unit 209 according to the first embodiment described herein.
Figure 4:
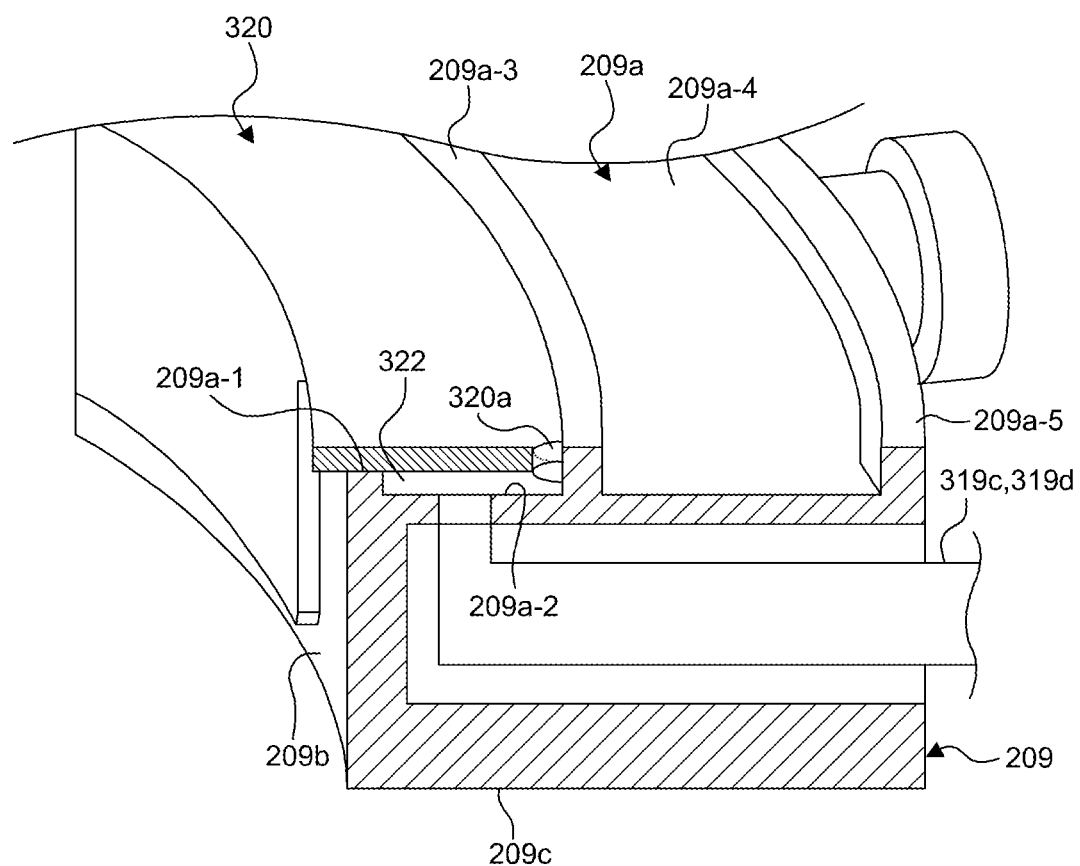
FIG. 4 is a perspective view illustrating a cross-section taken along the line B-B line of FIG. 3.

As illustrated in FIG. 2, the furnace opening unit 209 is formed of a metal such as stainless steal (SUS) and nickel (Ni) alloy, and cylindrical with an open upper end and an open lower end. The furnace opening unit 209 has an upper surface 209a, an inner circumferential surface 209b and a lower surface 209c (refer to FIG. 4). The inner circumferential surface 209b has a plurality of ports in which the gas supply units 232a and 232b, the inert gas supply units 232c and 232d, the cleaning gas supply unit 232e and the temperature sensor 263 are respectively mounted. In the first embodiment described herein, ports 319a, 319b, 319c, 319d, 319e and 319f are installed.

The gas supply units 232a and 232b are mounted in the ports 319a and 319b, respectively. The inert gas supply units 232c and 232d for supplying an inert gas such as $N_2$ gas are mounted in the ports 319c and 319d, respectively. The cleaning gas supply unit 232e is mounted in the port 319e. The temperature sensor 263 is installed in the port 310f.

Concave portions and convex portions are concentrically formed on the upper surface 209a of the furnace opening unit 209. Specifically, a convex portion 209a-1, a concave portion 209a-2 serving as a buffer trench, a convex portion 209a-3, a concave portion 209a-4 and a convex portion 209a-5 are sequentially formed from the inner circumference toward the outer circumference of the upper surface 209a. A plurality of furnace opening trenches 209d serving as communication paths connecting the concave portion 209a-2 to the inner circumferential surface 209b are formed in the convex portion 209a-1. In the first embodiment described herein, the furnace opening trench 209d is a groove or notch. The plurality of furnace opening trenches 209d may be holes penetrating the convex portion 209a-1. Holes 209e and 209e communicating with the ports 319c and 319d, respectively, are disposed at the concave portion 209a-2 above the ports 319c and 319d. An inert gas supplied through the inert gas supply units 232c and 232d is supplied to the concave portion 209a-2 through the ports 319c and 319*d* mounted in the inert gas supply units 232*c* and 232*d* and the holes 209*e* and 209*e* communicating with the ports 319*c* and 319*d*, respectively. The concave portion 209*a*-2 serving as a buffer trench functions as a gap 322 (refer to FIG. 4 described later) which is a flow path through which an inert gas flows.

The furnace opening trenches 209*d* are arranged at intervals depending on the distance from the hole 209*e*. Desirably, the arrangement intervals between the respective furnace opening trenches 209*d* may be reduced as the furnace opening trenches 209*d* are away from the hole 209*e*. The furnace opening trench 209*d* close to the hole 209*e* supplies a relatively large amount of inert gas to the inner circumferential surface of the furnace opening unit 209, and the furnace opening trench 209*d* away from the hole 209*e* supplies a relatively small amount of inert gas to the inner circumferential surface of the furnace opening unit 209. This is because, since the inert gas supplied from the hole 209*e* is supplied to the inner circumferential surface of the furnace opening unit 209 through the plurality of furnace opening trenches 209*d* while flowing through the concave portion 209*a*-2 (gap 322), the flow rate of the inert gas decreases until the inert gas reaches the furnace opening trench 209*d* away from the hole 209*e*. By reducing the arrangement intervals between the respective furnace opening trenches 209*d* as the furnace opening trenches 209*d* are away from the hole 209*e*, a sufficient flow rate of inert gas can be supplied to the furnace opening trench 209*d* away from the hole 209*e*, and the amounts of inert gas supplied to the inner circumferential surface of the furnace opening unit 209 from the respective furnace opening trenches 209*d* can be uniformized.

Depending on conditions such as the temperature distribution of the furnace opening unit 209 and the arrangement relation between the gas supply units, a region to which by-products easily adhere is formed on the surface of the furnace opening unit 209, or a region to which by-products hardly adhere is formed on the surface of the furnace opening unit 209. In this case, the arrangement intervals between the respective furnace opening trenches 209*d* may be properly adjusted to increase or decrease the amount of inert gas supplied through each of the furnace opening trenches 209*d*. For example, the arrangement intervals between the respective furnace opening trenches 209*d* may be increased for the region where by-products hardly adhere, and decreased for the region where by-products easily adhere.

The amount of inert gas supplied through each of the furnace opening trenches 209*d* may also be adjusted by changing the size of the furnace opening trench. For example, the opening area of the furnace opening trench 209*d* close to the hole 209*e* may be decreased, and the opening area of the furnace opening trench 209*d* away from the hole 209*e* may be increased.

Figure 3:
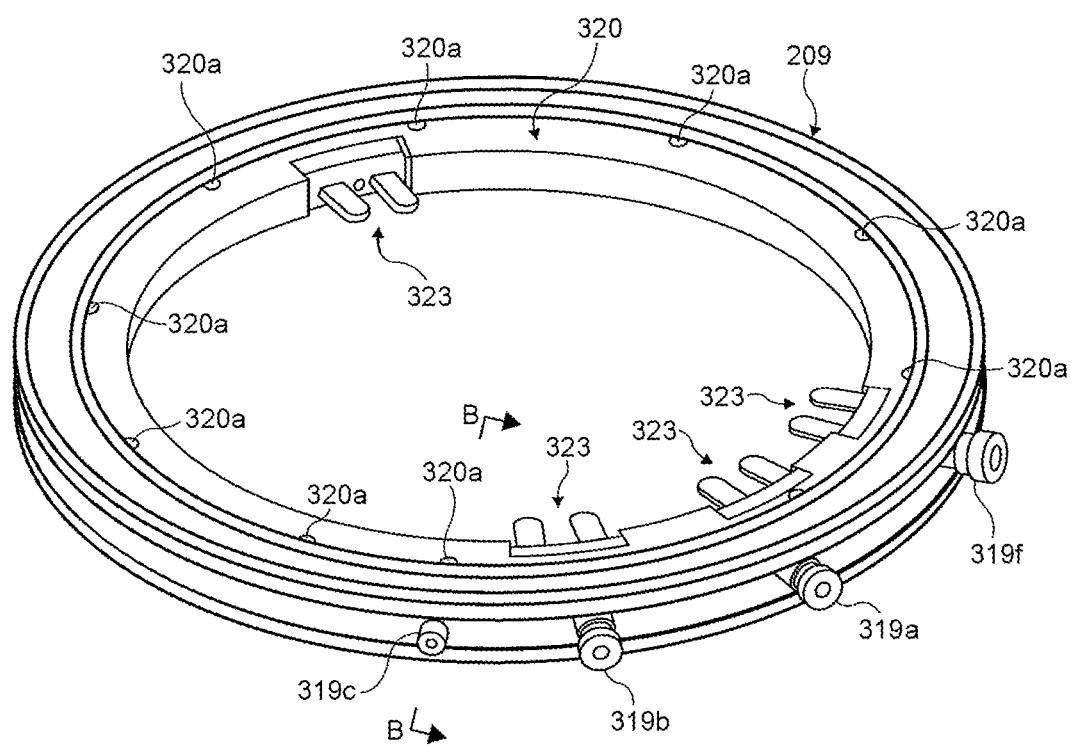
FIG. 3 is a perspective view illustrating a state in which a furnace opening cover 320 is mounted on the furnace opening unit 209 according to the first embodiment described herein.

As illustrated in FIG. 3, a furnace opening cover 320 serving as a cover member for covering the inner circumferential surface 209*b* of the furnace opening unit is mounted on the furnace opening unit 209. The furnace opening cover 320 is formed of a heat-resisting material such as quartz ($SiO_2$). The furnace opening cover 320 covers the convex portion 209*a*-1 and the concave portion 209*a*-2 of the upper surface of the furnace opening unit 209 constituting the process chamber 201 and the entirety of the inner circumferential surface 209*b*. That is, the cross-sectional surface of the furnace opening cover 320 has an L-shaped structure that includes a side portion running along the inner circumferential surface 209*b* and a horizontal portion extending in a horizontal direction from the upper end of the side portion.

Notches 323 for mounting the temperature sensor 263 and the nozzles 233*a*, 333*b* and 233*e* as the gas introduction units in the ports 319 are disposed at the inner circumferential surface of the furnace opening cover 320. Furnace opening cover trenches 320*a* are disposed at the outer circumference of the upper surface of the furnace opening cover 320. In the first embodiment described herein, each of the furnace opening cover trenches 320*a* is a groove or notch. The furnace opening cover trenches 320*a* may be holes penetrating the upper surface of the furnace opening cover 320. Through the gap 322 and the furnace opening cover trenches 320*a*, an inert gas may be supplied to above the furnace opening cover 320, thereby preventing by-products from adhering to the contact surface between the furnace opening unit 209 and the process tube 203.

The intervals between the respective furnace opening cover trenches 320*a* may be decreased as the furnace opening cover trenches 320*a* are away from the hole 209*e*. Such a structure can prevent the decrease in amount of supplied inert gas as the furnace opening cover trenches 320*a* are away from the inert gas supply units 232*c* and 232*d*. Thus, an inert gas (purge gas) can be uniformly supplied onto the inner circumferential surface of the furnace opening cover 320.

Figure 5:
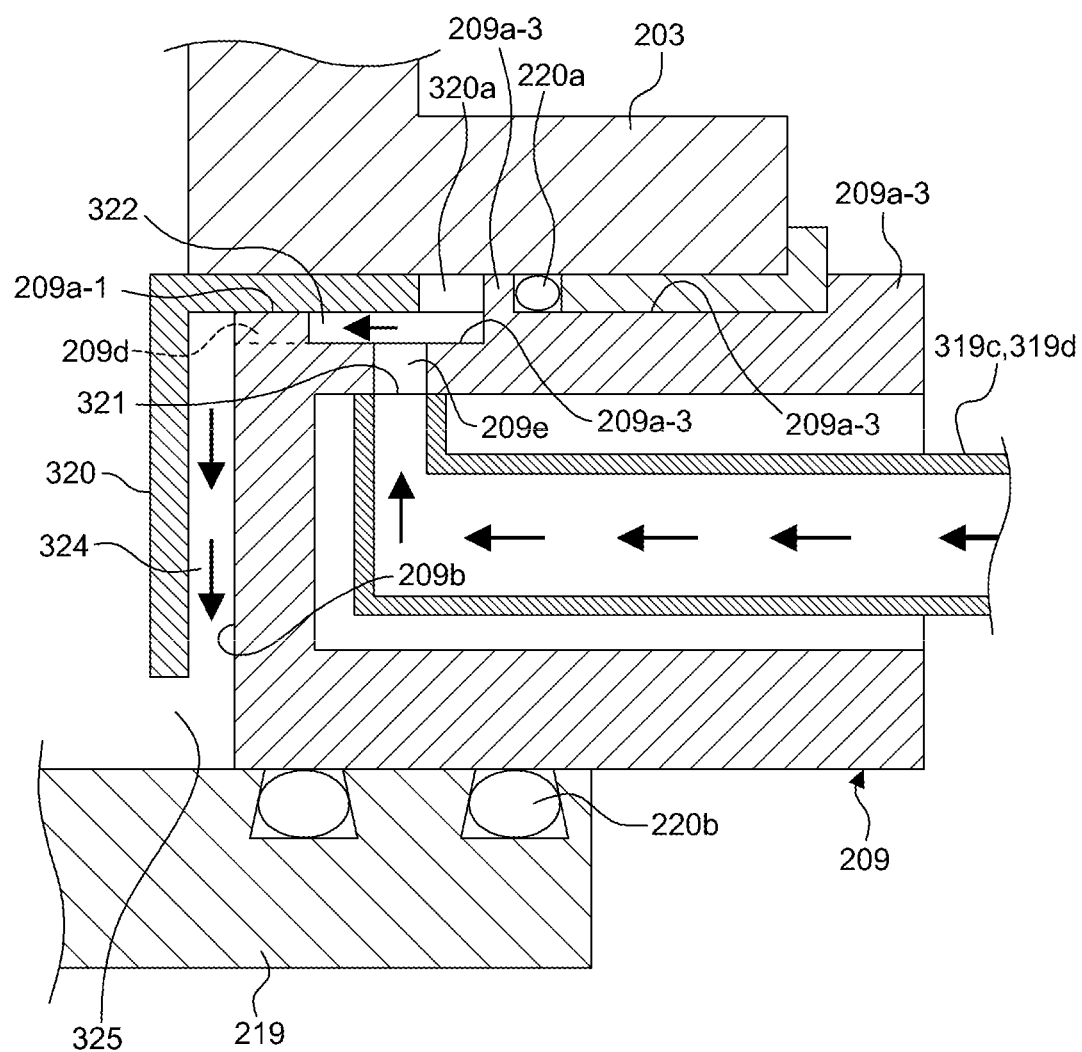
FIG. 5 is a cross-sectional view illustrating surroundings of an inert gas supply port 321 at a lower end of the reaction tube according to the first embodiment described herein.

As illustrated in FIG. 5, the gap 322 serving as a flow path for passing an inert gas is disposed between the furnace opening cover 320 and the concave portion 209*a*-2 of the upper surface of the furnace opening unit 209, with the furnace opening cover 320 mounted on the furnace opening unit 209. A gap 324 serving as a flow path for passing an inert gas is disposed between the inner circumferential surface 209*b* of the furnace opening unit 209 and the furnace opening cover 320. A gap 325 serving as a flow path for passing an inert gas is disposed under the furnace opening cover 320.

That is, the inert gas such as $N_2$ gas is supplied into the gap 322 through the hole 209*e* and the inert gas supply units 232*c* and 232*d* connected to the ports 319*c* and 319*d*, and supplied into the gap 324 and the gap 325 through the furnace opening trench 209*d*, the gap 324 being disposed along the entirety of the inner circumferential surface of the furnace opening unit 209 and corresponding to the space between the furnace opening unit 209 and the furnace opening cover 320. Thus, the upper surface and the inner circumferential surface of the furnace opening unit 209 are purged.

The first embodiment described herein exemplifies the gap 322 formed at the upper surface of the furnace opening unit 209. However, the first embodiment is not limited thereto. In the first embodiment described herein, a gap communicating with the inner circumferential surface 209*b* of the furnace opening unit 209 may be formed at a surface of the furnace opening cover 320, facing the upper surface of the furnace opening unit 209. Thus, the inert gas can be uniformly supplied between the furnace opening unit 209 and the furnace opening cover 320, thereby more efficiently suppressing the occurrence of particles.

The first embodiment described herein exemplifies that the inert gas supply units 232*c* and 232*d* are connected to the ports 319*c* and 319*d*, and the inert gas (purge gas) is supplied between the inner circumferential surface of the furnace opening unit 209 and the furnace opening cover 320. However, the cleaning gas supply unit 232*e* for supplying a cleaning gas such as hydrogen fluoride (HF) may be connected to the third and fourth ports 319*c* and 319*d*. The supply of the cleaning gas between the inner circumferential surface of the furnace opening unit 209 and the furnace opening cover 320 can remove by-products, and prevent the occurrence of particles.

A controller 280 serving as a control unit controls the APC valve 243, the heater 207, the temperature sensor 263, the vacuum pump 246, the rotating mechanism 267 and the boat elevator 215.

Figure 6:
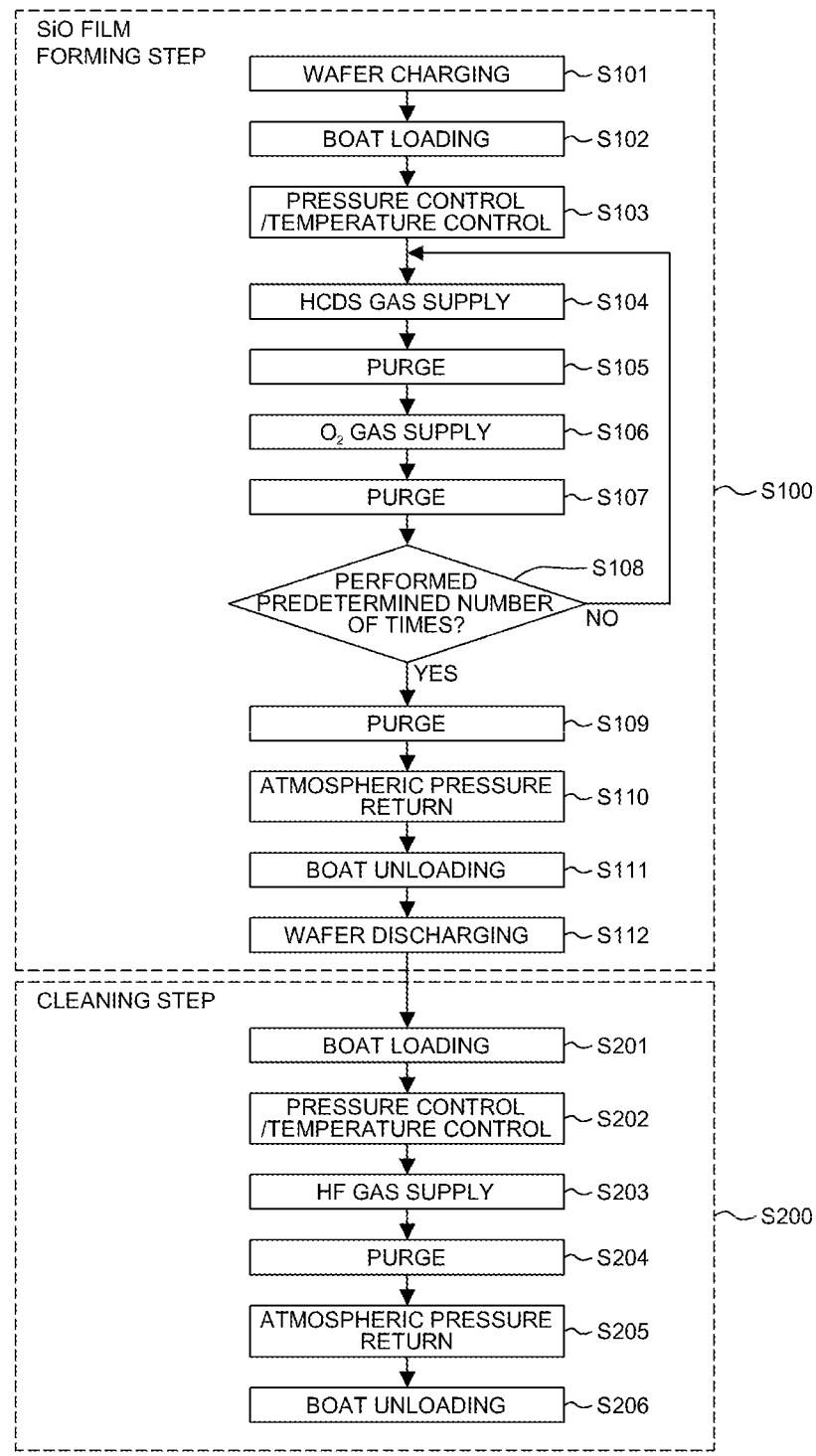
FIG. 6 is a flowchart illustrating a film forming step and a cleaning step which can be performed in the substrate processing apparatus according to the first embodiment described herein.

Next, a substrate processing process according to the first embodiment described herein will be described with reference to FIGS. 1 and 6. The substrate processing process according to the first embodiment described herein includes a SiO film forming step S100 for forming a SiO film on a wafer 200 and a cleaning step S200 for removing deposits adhering to a portion such as the inner wall of the process chamber 201. In the following descriptions, the respective units constituting the substrate processing apparatus are controlled by the controller 280.

While at least the wafer 200 is processed during the substrate processing process according to the first embodiment described herein, an inert gas is supplied through the gas supply units 232*a* and 232*b* and the inert gas supply units 232*c* and 232*d* which are installed at the lower end of the process tube 203. In the substrate processing process according to the first embodiment described herein, the inert gas may be supplied at all times. Desirably, however, when a metallic member such as the rotating shaft 255 of which a part is exposed in the process chamber 201 is likely to corrode, for example, a corrosive gas is supplied into the process chamber 201 or remains in the process chamber 201, the inert gas may be supplied.

<SiO Film Forming Step S100>

At the SiO film forming step S100, steps S104 and S106 are repeated to form a SiO film on the wafer 200. The step S104 includes forming a silicon-containing layer on the wafer 200 by supplying hexachloro-disilane ($Si_2Cl_6$, abbreviated to HCDS) gas as a raw material gas onto the wafer 200, and the step S104 includes oxidizing the silicon-containing layer by supplying $O_2$ gas under a pressure less than the atmospheric pressure. Hereafter, the SiO film forming step S100 will be described in detail.

[Step S101 and Step S102]

After the boat 217 is charged with the wafers 200 at step S101 (wafer charging), the opening of the lower end of the furnace opening unit 209 is opened. As illustrated in FIG. 1, the boat 217 supporting the wafers 200 is lifted by the boat elevator 215 and loaded into the process chamber 201 at step S102 (boat loading). With the boat 217 loaded in the process chamber 201, the seal cap 219 seals the lower end of the furnace opening unit 209 with the O-ring 220*b* interposed therebetween.

[Step S103]

The inner pressure of the process chamber 201 is adjusted to a desired degree of vacuum by the pressure sensor 245, the APC valve 243 and the vacuum pump 246. While the process chamber 201 is heated by the heater 207, the inner temperature of the process chamber 201 is adjusted to a desired temperature by the temperature sensor 263. Then, four film forming steps S104 through S107 described later are sequentially performed.

[Step S104]

With the vacuum pump 246 operated, a raw material gas, for example, HCDS gas is supplied through the first nozzle 233*a*. The flow rate of HCDS gas is adjusted by an MFC (Mass Flow Controller) (not illustrated). The HCDS gas of which the flow rate is adjusted is supplied into the process chamber 201 through the first nozzle 233*a* and exhausted through the exhaust pipe 231 (HCDS gas supply). Simultaneously, an inert gas such as $N_2$ gas is supplied into the first nozzle 233*a*. The inert gas is supplied with the HCDS gas into the process chamber 201, and exhausted through the exhaust pipe 231.

Examples of a silicon-containing raw material gas may include inorganic raw material gases such as dichlorosilane ($SiH_2Cl_2$, abbreviated to DCS) gas, tetrachlorosilane ($SiCl_4$, abbreviated to TCS) gas and monosilane ($SiH_4$) gas and organic raw material gases such as amino-silane-based tetrakis(dimethylamino)silane ($Si(N(CH_3)_2)_4$, abbreviated to 4DMAS) gas, tris(dimethylamino)silane ($Si(N(CH_3)_2)_3H$, abbreviated to 3DMAS) gas, bis(diethylamino)silane ($Si(N(C_2H_5)_2)_2H_2$, abbreviated to 2DEAS) gas and bis(tertiary-butyl-amino)silane ($SiH_2(NH(C_4H_9))_2$, abbreviated to BTBAS), in addition to the HCDS gas. In addition to $N_2$ gas, rare gases such as Ar gas, He gas, Ne gas and Xe gas may be used as the inert gas.

[Step S105]

After the silicon-containing layer is formed on a portion such as the surface of the wafer 200, the supply of HCDS gas is stopped. At this time, by vacuum-exhausting the inner atmosphere of the process chamber 201 through the vacuum pump 246 with the APC valve 243 of the exhaust pipe 231 open, the HCDS gas remaining in the process chamber 201 is removed from the process chamber 201. At this time, when an inert gas is supplied into the process chamber 201, the remaining HCDS gas can be more efficiently removed (purge).

[Step S106]

After the process chamber 201 is purged, an oxygen-containing gas such as $O_2$ gas and an inert gas such as $N_2$ gas are supplied through the second nozzle 233*b*. After the oxygen-containing gas and the inert gas are supplied into the process chamber 201 through the second gas supply hole 248*b*, the oxygen-containing gas and the inert gas are exhausted through the exhaust pipe 231.

In addition to $O_2$ gas, a gas such as ozone ($O_3$) gas may be used as the oxygen-containing gas.

[Step S107]

After a silicon-containing layer is modified into a silicon oxide layer, the supply of the oxygen-containing gas is stopped. At this time, by vacuum-exhausting the process chamber 201 through the vacuum pump 246 with the APC valve 243 of the exhaust pipe 231 open, the oxygen-containing gas remaining in the process chamber 201 is removed from the process chamber 201. At this time, when an inert gas is supplied into the process chamber 201, the remaining oxygen-containing gas can be more efficiently removed.

[Step S108]

The cycle in which the above-described steps S104 through S107 are sequentially performed is performed a predetermined number of times. Thus, a predetermined thickness of SiO film may be formed on the wafer 200, the surface of the boat 217, and a member in the process chamber 201 such as the inner wall of the process chamber 201.

[Step S109 and Step S110]

After the predetermined thickness of SiO film is formed, an inert gas is supplied into the process chamber 201 from the first and second nozzles 233*a* and 233*b*, and exhausted through the exhaust pipe 231. The inert gas serves as a purge gas. The inside of the process chamber 201 is purged by the inert gas, and the gas remaining in the process chamber 201 is removed from the process chamber 201 (purge). Then, the inner atmosphere of the process chamber 201 is replaced with the inert gas, and the inner pressure of the process chamber 201 is returned to normal pressure (atmospheric pressure return).

[Step S111 and Step S112]

As the seal cap 219 is lowered by the boat elevator 215, the lower end of the furnace opening unit 209 is opened. The processed wafer 200 is unloaded from the lower end of the furnace opening unit 209 to the outside of the reaction tube 203, with the wafer 200 supported by the boat 217 (boat unloading). After the boat is unloaded, the lower end opening of the furnace opening unit 209 is sealed by a shutter (not illustrated) with an O-ring 220c interposed therebetween (shutter closing). Then, the processed wafer 200 is discharged from the boat 217 (wafer discharging).

Next, the cleaning step S200 of the process furnace 202 according to the first embodiment described here will be described.

<Cleaning Step S200>

When the SiO film forming step S100 is repeated, the SiO film is accumulated on members in the process chamber 201. That is, deposits including SiO are adhered to and accumulated on the portion such as the inner wall of the process tube 203. When the thickness of the deposits adhered to and accumulated on the portion such as the inner wall reaches a predetermined thickness of 1 μm to 5 μm, for example, before the deposits are peeled off or fall, the inside of the process tube 203 is cleaned. When the inside of the process tube 203 is cleaned, the deposits accumulated in the process chamber 201 are removed by supplying HF gas as the cleaning gas into the process chamber 201 heated to a predetermined temperature or supplying HF gas diluted by the inert gas into the process chamber 201. Hereafter, the cleaning step S200 will be described in detail.

[Step S201]

After the processed wafer 200 is discharged from the boat 217, the empty boat 217 is lifted by the boat elevator 215 and loaded into the process chamber 201 (boat loading). In this state, the seal cap 219 seals the lower end of the furnace opening unit 209 with the O-ring 220b interposed therebetween.

[Step S202]

The process chamber 201 is vacuum-exhausted by the vacuum pump 246 such that the inner pressure of the process chamber 201 becomes a desired degree of vacuum. At this time, the inner pressure of the process chamber 201 is measured through the pressure sensor 245, and the APC valve 243 is feedback-controlled based on the measured pressure information (pressure control). The process chamber 201 is heated by the heater 207 until the inner temperature of the process chamber 201 reaches a desired temperature. At this time, until the inner temperature of the process chamber 201 reaches the desired temperature (cleaning temperature), power supplied to the heater 207 is feedback-controlled based on temperature information detected by the temperature sensor 263 (temperature control).

[Step S203]

Then, HF gas is supplied as a cleaning gas into the third nozzle 233e in a state where the inner temperature and pressure of the process chamber 201 are maintained at a predetermined temperature and pressure (HF gas supply). The HF gas is supplied into portions such as the boat 217 and the inner wall of the process chamber 201 through the third nozzle 233e, and exhausted through the exhaust pipe 231.

When the HF gas introduced into the process chamber 201 or diluted HF gas is passed through the inside of the process chamber 201, the HF gas comes in contact with the deposits including a thin film such as SiO, which are accumulated on the inner wall of the process chamber 201 or the surface of the boat 217. At this time, the deposits are removed by a thermo-chemical reaction. That is, the deposits are removed by an etching reaction between the deposits and active species generated by thermal decomposition of the HF gas.

[Step S204]

When the cleaning of the process chamber 201 is end after a preset deposit etching time has elapsed, the supply of HF gas or diluted HF gas into the process chamber 201 is stopped. Then, by supplying an inert gas such as $N_2$ gas into the process chamber 201 and exhausting the inert gas through the exhaust pipe 231, the inside of the process chamber 201 is purged.

In addition to HF gas, fluorine-containing gases such as chlorine trifluoride ($ClF_3$) gas, nitrogen trifluoride ($NF_3$) gas and fluorine ($F_2$) gas may be used as the cleaning gas.

[Step S205]

When the inside of the process chamber 201 is purged by the inert gas such that the gas remaining in the process chamber 201 is removed from the process chamber 201, the inner atmosphere of the process chamber 201 is replaced with the inert gas, and the inner pressure of the process chamber 201 is returned to normal pressure (atmospheric pressure return).

[Step S206]

Then, as the seal cap 219 is lowered by the boat elevator 215, the lower end of the furnace opening unit 209 is opened. The empty boat 217 is unloaded to the outside of the process tube 203 through the lower end of the furnace opening unit 209 (boat unloading).

Figure 7:
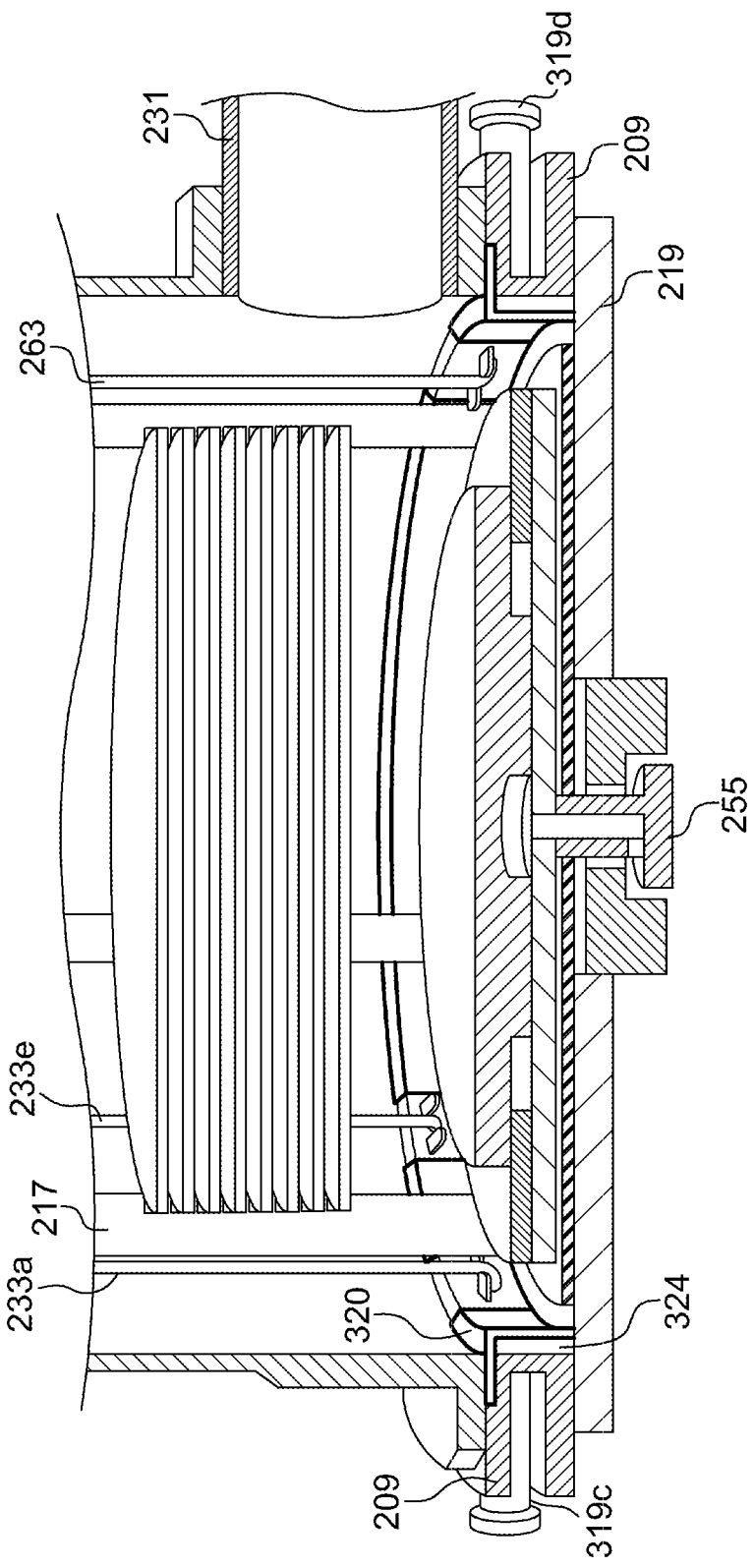
FIG. 7 is a perspective view illustrating a cross-section of the lower end portion of the reaction tube of the substrate processing apparatus according to the first embodiment described herein.

As illustrated in FIG. 7, an inert gas is supplied into the gap 322 of the upper surface of the furnace opening unit 209 through the inert gas supply units 232c and 232d connected to the ports 319c and 319d, respectively, and supplied to the gaps 324 and 325 formed along the entirety of the inner circumferential surface of the furnace opening unit 209 through the furnace opening trench 209d, thereby purging the upper surface and inner circumferential surface of the furnace opening unit 209. Then, since the inert gas covers the surface of the furnace opening unit 209, the contact area between a process gas and the upper surface and inner circumferential surface of the furnace opening unit 209 is reduced. Therefore, although a corrosive gas is used as the process gas, the occurrence of particles can be suppressed while the corrosion of the furnace opening unit is suppressed. As the inert gas is supplied between the inner circumferential surface 209b of the furnace opening unit 209 and the furnace opening cover 320 through the gap 322, the inert gas flows downward in the gap 324 between the furnace opening unit 209 and the furnace opening cover 320 (down flow). Thus, although by-products adhering to the gaps 322 and 324 are peeled off, the by-products can be prevented from scattering as particles in the wafer region.

In order to increase the purge effect of the furnace opening unit in the first embodiment described herein, the clearance between the furnace opening unit 209 and the furnace opening cover 320 may be set to a small value of not more than 2mm, for example, as illustrated in FIG. 7. When the clearance between the furnace opening unit 209 and the furnace opening cover 320 is narrow, it is possible to efficiently prevent by-products from adhering to the inner circumferential surface of the furnace opening unit 209. The by-products adhering to the inner circumferential surface of the furnace opening unit 209 can be removed by supplying an inert gas through the ports 319c and 319d. The cleaning gas supply unit may be connected to the ports 319c and 319d and supply a cleaning gas through the ports 319c and 319d.

Next, a substrate processing apparatus according to a second embodiment described herein will be described with reference to FIG. 8. In the second embodiment illustrated in FIG. 8, the ports 319c and 319d connected to the respective inert gas supply units 232c and 232d are formed through the sidewall of the furnace opening unit 209. Thus, an inert gas is directly supplied to the gap 324 formed between the inner circumferential surface of the furnace opening unit 209 and the furnace opening cover 320, without passing through the gap 322.

Figure 8:
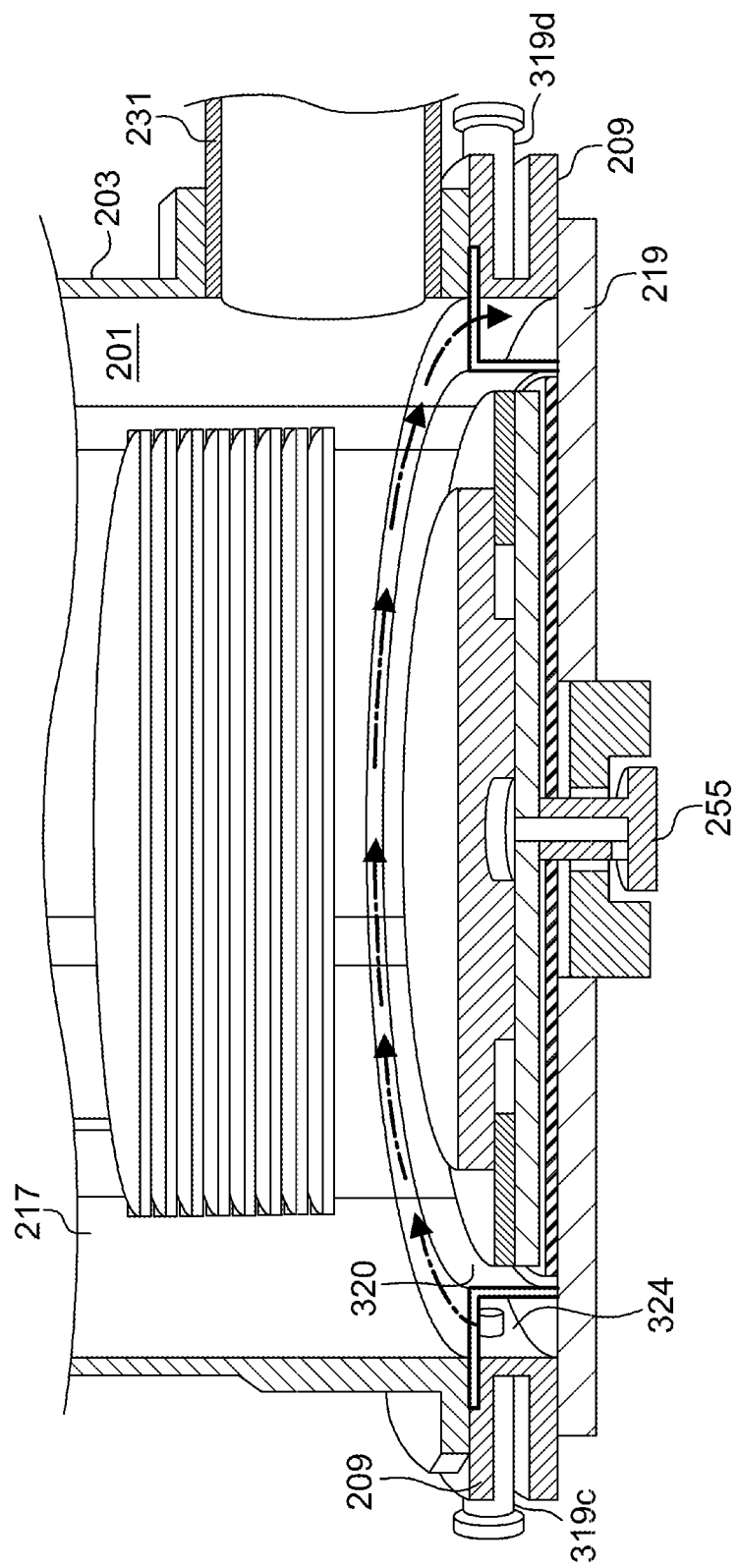
FIG. 8 schematically illustrates a substrate processing apparatus according to a second embodiment described herein.

Although the clearance between the inner circumferential surface of the furnace opening unit 209 and the furnace opening cover 320 is wide as illustrated in FIG. 8, a flow path of inert gas can be formed to prevent the corrosion of the furnace opening unit, thereby suppressing the occurrence of particles. Although a cleaning gas is used instead of the inert gas, the cleaning efficiency can be improved, and the maintenance time can be shortened. In second embodiment described herein, a flow path of inert gas can be formed even when the furnace opening unit having a complex shape is used.

As the furnace opening cover 320 is installed to cover the upper surface and inner circumferential surface of the furnace opening unit 209 and the inert gas and the cleaning gas are supplied between the furnace opening unit 209 and the furnace opening cover 320, the inert gas and the cleaning gas are supplied onto the inner surface of the process chamber 201 of the furnace opening unit 209, thereby preventing corrosion or adhesion of by-products to the furnace opening unit 209.

Next, the second embodiment described herein will be described in detail. In the second embodiment, the descriptions of the same components as those of the first embodiment are omitted herein.

Figure 9:
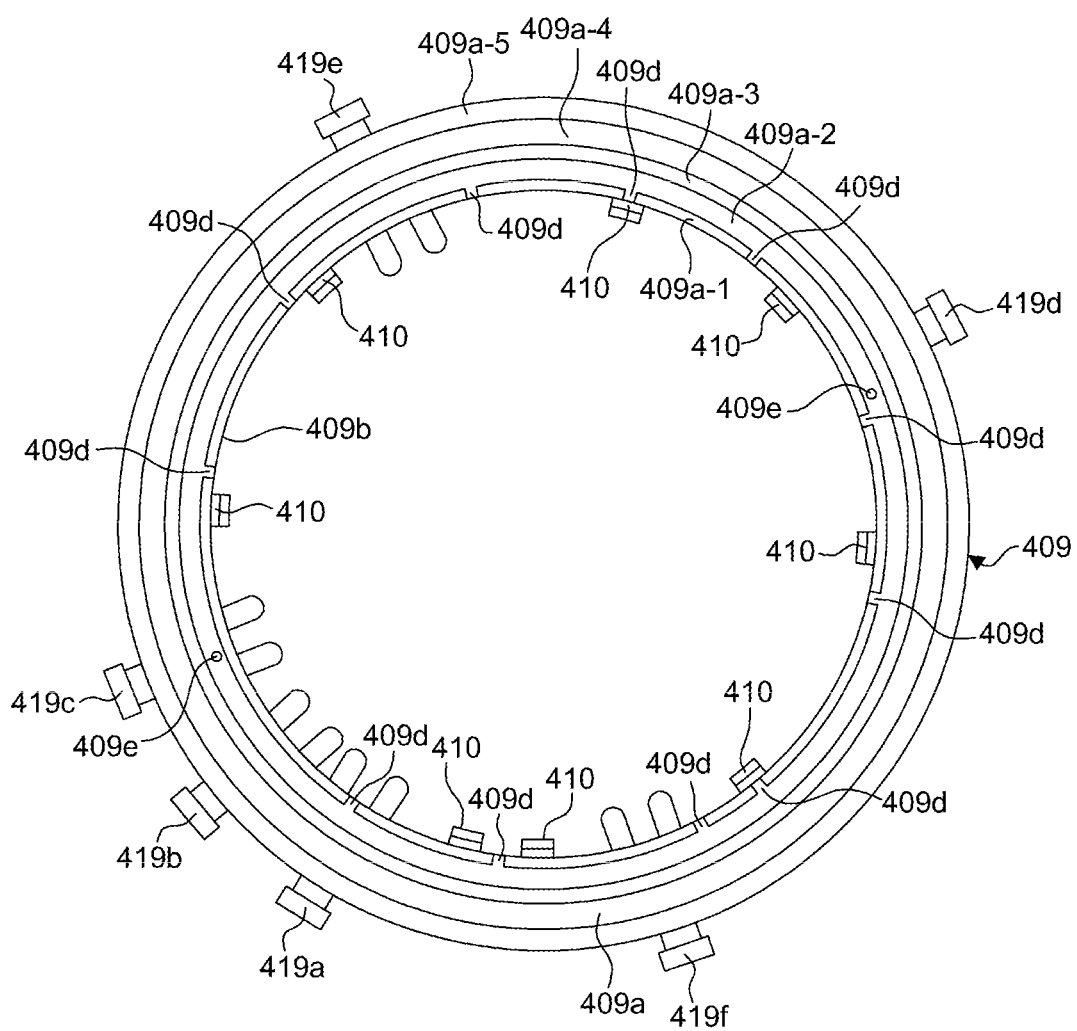
FIG. 9 is a plan view of a furnace opening unit 409 according to the second embodiment described herein.

FIG. 9 is a plan view of a furnace opening unit 409 according to the second embodiment described herein.

The second embodiment is different from the first embodiment in that a furnace opening cover 520 according to the second embodiment is divided into a plurality of furnace opening cover members with an annular sector shape. A plurality of projections 410 for installing the furnace opening cover 520 protruding inward are installed at the inner circumferential surface 409b of the furnace opening unit 409. The plurality of projections 410 are arranged at unequal intervals therebetween.

Figure 10:
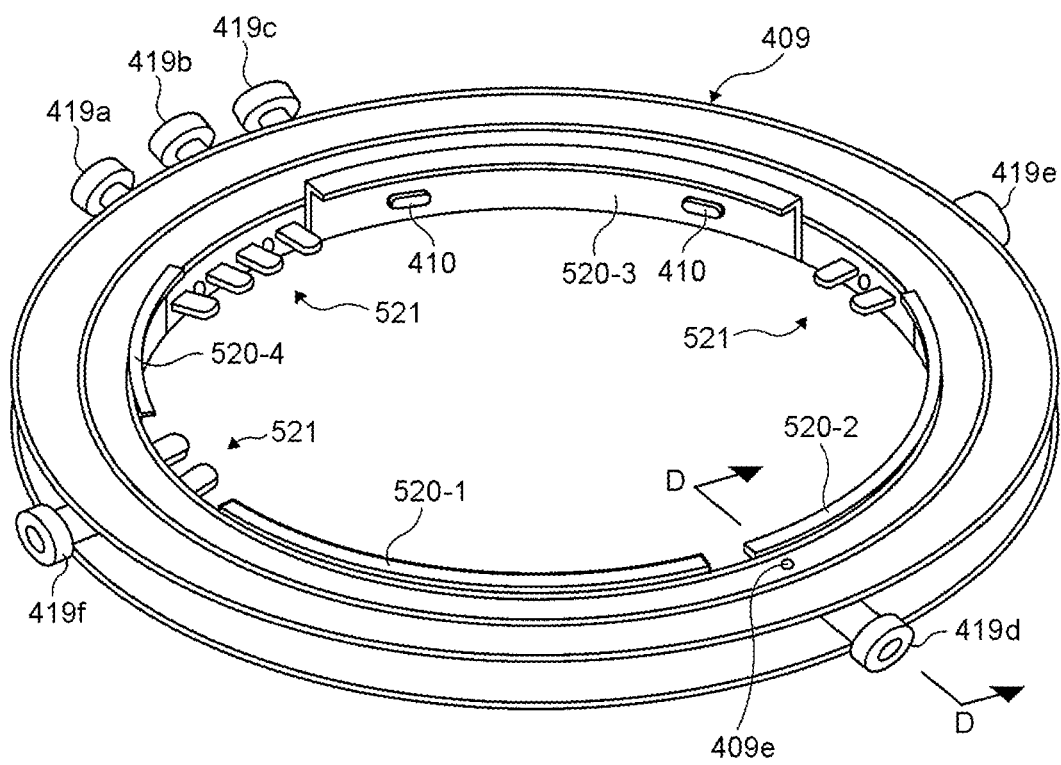
FIG. 10 is a perspective view illustrating a state in which a furnace opening cover 520 is mounted on the furnace opening unit 409 according to the second embodiment described herein.

As illustrated in FIG. 10, the furnace opening cover includes a plurality of large and small furnace opening cover members which are divided along the circumferential direction. Referring to FIG. 10, the plurality of large and small furnace opening cover members cover the furnace opening unit 409 except locations at which the nozzles 233a, 233b and 233e or nozzle supports 521 for supporting the nozzles 233a, 233b and 233e are installed, thereby protecting the furnace opening unit 409. The furnace opening cover includes four furnace opening cover members 520-1 through 520-4, for example. The four furnace opening cover members 520-1 through 520-4 are mounted on the furnace opening unit 409. By mounting the plurality of furnace opening cover members on the furnace opening unit 409, the corrosion of the furnace opening unit 409 can be prevented.

Figure 11A:
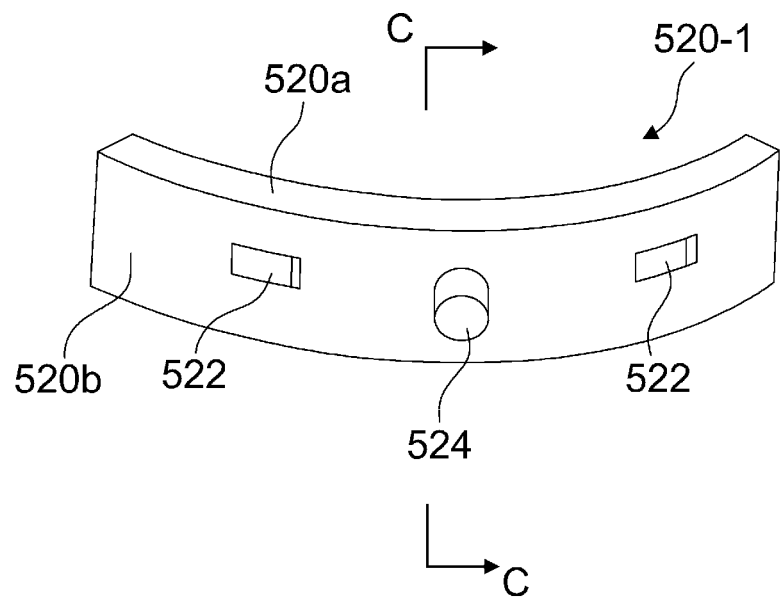
FIG. 11A is a perspective view of a furnace opening cover member 520-1 according to the second embodiment described herein.
Figure 11B:
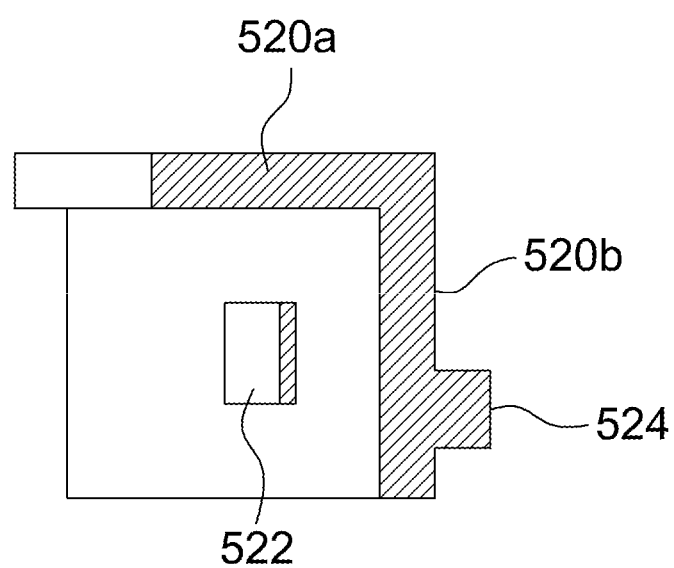
FIG. 11B is a cross-sectional view taken along the line C-C of FIG. 11A.

The four furnace opening cover members 520-1 through 520-4 have different sizes, but include common components. In the second embodiment, the furnace opening cover member 520-1 among the plurality of furnace opening cover members will be representatively described with reference to FIGS. 11A and 11B.

The furnace opening cover member 520-1 has an annular sector shape, and includes an upper portion 520a protruding in the horizontal direction at the inner circumference and a side surface portion 520b extending in substantially the vertical direction from the outer circumference of the upper portion 520a and facing the inner circumferential surface 409b of the furnace opening unit 409. The furnace opening cover member 520-1 includes openings 522 formed at the side surface portion 520b so as to install the furnace opening cover member 520-1 onto the L-shaped projections 410 of the furnace opening unit 409. The furnace opening cover member 520-1 may include two openings, for example. A protrusion 524 protruding outward [toward the furnace opening unit 409] is installed between the two openings 522 and 522. As the two openings 522 are hooked to the respective projections 410, the furnace opening cover member 520-1 is coupled to the furnace opening unit 409. The upper surface of the furnace opening cover member 520-1 is positioned at a higher level than at least the concave portion 409a-2 of the upper surface of the furnace opening unit 409. More desirably, the upper surface of the furnace opening cover member 520-1 is positioned at a level equal to or higher than the upper surface of the convex portion 409a-1.

The furnace opening cover members 520-1 through 520-4 cover the entirety of the inner circumferential surface 409b of the furnace opening unit 409 constituting the process chamber 201. As the openings 522 are hooked to the projections 410 of the furnace opening unit 409 and the protrusions 524 are in contact with the inner circumferential surface of the furnace opening unit 409, the furnace opening cover members 520-1 through 520-4 are mounted on the furnace opening unit 409. Thus, a clearance between the furnace opening cover 520 and the inner circumferential surface of the furnace opening unit 409 is secured to form a gap serving as a flow path through which an inert gas flows. Furthermore, the furnace opening cover 520 is prevented from swaying with respect to the furnace opening unit 409. As the furnace opening cover 520 is hooked to the furnace opening unit 409, the furnace opening cover 520 can be simply exchanged even though the furnace opening unit 409 is not detached.

The L-shaped upper end of the furnace opening cover 520 protruding inward is exemplified in the second embodiment described herein. However, the second embodiment is not limited to such an example. For example, the upper end of the furnace opening cover 520 may additionally protrude outward about 1-2 mm to have a T-shape. That is, the furnace opening cover 520 may include a side surface portion running along the inner circumferential surface 409b and an extension portion extending inward and outward in a horizontal direction from the upper end of the side surface portion. The projection 410 may not be L-shaped, but cylindrical. The furnace opening cover 520 may be installed by inserting the projections 410 into the openings 522.

Figure 12:
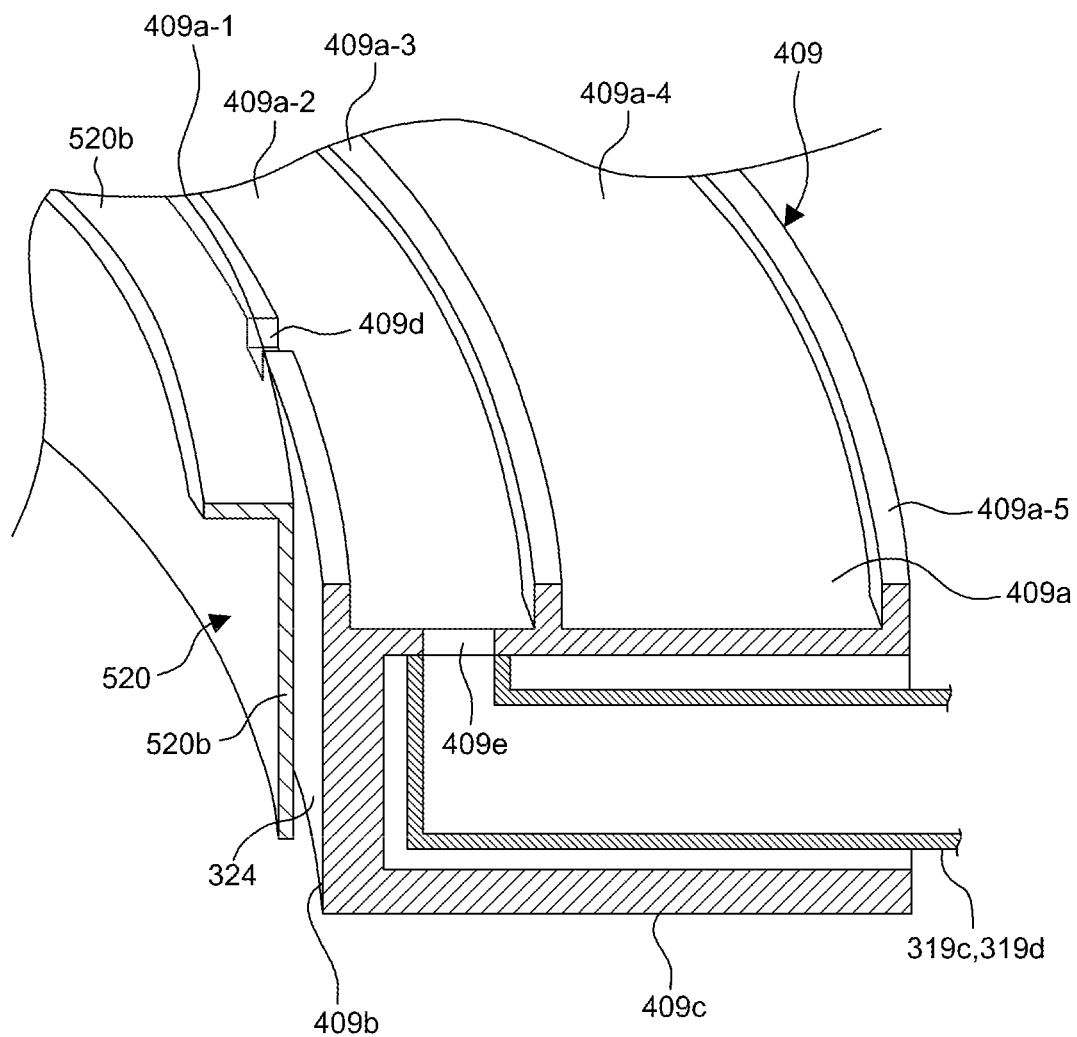
FIG. 12 is a perspective view illustrating a cross-section taken along the line D-D of FIG. 10.
Figure 13:
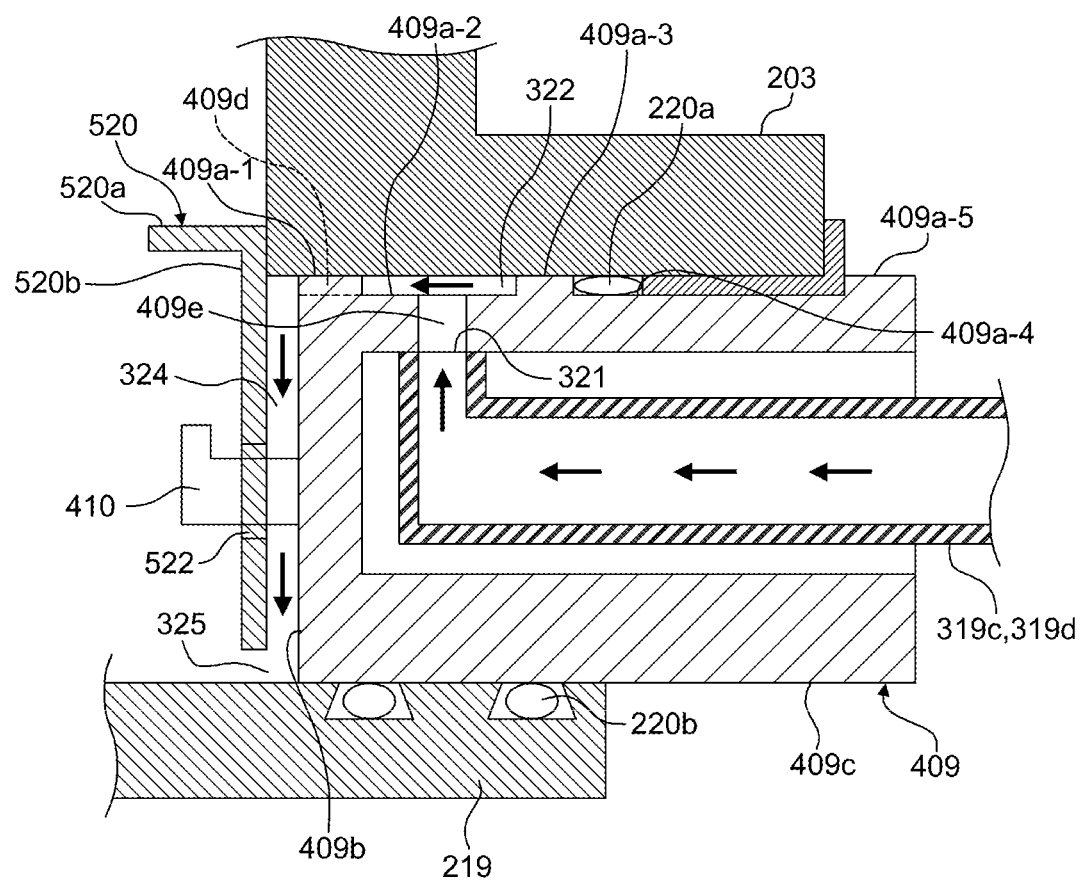
FIG. 13 is a cross-sectional view illustrating surroundings of an inert gas supply port 321 at a lower end portion of the reaction tube according to the second embodiment described herein.

As illustrated in FIGS. 12 and 13, the lower surface of the process tube 203 is mounted on the upper surface 409a of the furnace opening unit 409. With the process tube 203 mounted on the furnace opening unit 409, the gap 322 serving as a flow path through which an inert gas flows is formed between the concave portion 409a-2 of the upper surface of the furnace opening unit 409 and the lower surface of the process tube 230. The gap 324 serving as a flow path through which an inert gas flows is formed between the inner circumferential surface 409b of the furnace opening unit 409 and the outer circumferential surface of the furnace opening cover 520. The gap 325 serving as a flow path through which an inert gas flows is formed under the furnace opening cover 520.

The inert gas such as $N_2$ gas is supplied onto the lower surface of the process tube 203 along the circumferential direction through the inert gas supply units 232c and 232d connected to the ports 319c and 319d, the gap 322 and the hole 409e, and supplied into the gap 324 and the gap 325 through a furnace opening trench 409d, the gap 324 formed along the entirety of the inner circumferential surface of the furnace opening unit 409 and corresponding to the space between the furnace opening unit 409 and the furnace opening cover 520. Then, while the upper surface and inner circumferential surface of the furnace opening unit 409 are purged, the inert gas covers the surface of the furnace opening unit. Thus, the contact area between a process gas and the upper surface and inner circumferential surface of the furnace opening unit 409 is reduced. Therefore, although a corrosive gas is used as the process gas, the occurrence of particles can be suppressed while the corrosion of the furnace opening unit is suppressed. When an inert gas is supplied to the gaps 324 and 325 through the gap 322 and the furnace opening trench 409d, the inert gas flows downward in the gap 324 between the furnace opening unit 409 and the furnace opening cover 520 (down flow). Such a structure can prevent particles from penetrating the wafer region or clogging the inner circumferential surface of the furnace opening cover 320.

While supplying the inert gas through the port 319c and 319d are exemplified in the second embodiment described herein, the second embodiment is not limited thereto. For example, a cleaning gas such as HF gas may be supplied instead of the inert gas, and a mixture of the inert gas and the cleaning gas may be supplied.

The embodiments described above have at least one of the following effects (1) through (8).

(1) By installing the furnace opening cover 320 to cover the upper surface and inner circumferential surface of the furnace opening unit 209 and supplying an inert gas and a cleaning gas between the furnace opening unit 209 and the furnace opening cover 320, the inner surface of the process chamber 201 of the furnace opening unit 209 can be covered by the inert gas and the cleaning gas, and the corrosion of the furnace opening unit 209 can be prevented while by-products are prevented from adhering to the furnace opening unit 209.

(2) By reducing the arrangement intervals between the respective furnace opening trenches 209d as the furnace opening trenches 209d are away from the hole 209e, the reduction in amount of supplied inert gas with the furnace opening trenches 209d away from the hole 209e can be prevented, and the inner surface of the furnace opening unit 209 can be efficiently purged (exhausted/replaced).

(3) By properly adjusting the arrangement intervals between the respective furnace opening trenches 209d or the opening areas of the furnace opening trenches 209d, the amount of inert gas supplied to the inner circumferential surface of the furnace opening unit 209 can be adjusted, and the inner circumferential surface of the furnace opening unit 209 can be purged more efficiently.

(4) By forming the plurality of furnace opening cover trenches 320a at the outer circumference of the upper surface of the furnace opening cover 320, an inert gas can be supplied to above the furnace opening cover 320 from the gap 322. Thus, by-products can be prevented from adhering to the contact surface between the furnace opening unit 209 and the process tube 203. The intervals between the respective furnace opening cover trenches 320a may be reduced depending on the distance from the hole 209e. Such a structure can prevent the decrease in amount of supplied inert gas with the furnace opening cover trenches 320a away from the inert gas supply units 232c and 232d. Thus, the inert gas (purge gas) can be uniformly supplied onto the inner circumferential surface of the furnace opening cover 320. The exhaust pipe 231 may be installed above the furnace opening cover trench 320a. Thus, the inert gas can be supplied more uniformly and efficiently.

(5) By supplying an inert gas between the inner circumferential surface 209b of the furnace opening unit 209 and the furnace opening cover 320 through the gap 322, the inert gas flows downward in the gap 324 between the furnace opening unit 209 and the furnace opening cover 320 (down flow). Thus, although by-products adhering to the gaps 322 and 324 are peeled off, the by-products can be prevented from scattering as particles in the wafer region.

(6) As the furnace opening cover 520 is constituted by the plurality of furnace opening cover members 520-1 through 520-4, the plurality of furnace opening cover members 520-1 through 520-4 almost cover the inner circumferential surface 409b of the furnace opening unit 409, the openings 522 are hooked to the projections 410 of the furnace opening unit 409, and the protrusions 524 are mounted to be in contact with the inner circumferential surface of the furnace opening unit 409, the furnace opening cover 520 can secure a clearance from the inner circumferential surface of the furnace opening unit 409. Thus, a gap through which an inert gas flows can be formed to suppress the furnace opening cover 520 from swaying with respect to the furnace opening unit 409.

(7) As the L-shaped furnace opening cover 520 protruding in the horizontal direction is hooked to the furnace opening unit 409, the furnace opening cover 520 can be simply exchanged even though the furnace opening unit 409 is not detached.

(8) As the upper surface of the furnace opening cover 520 installed on the furnace opening unit 409 is set at a higher level than the furnace opening trench 409d, an inert gas supplied through the furnace opening trench 409d can be efficiently supplied to the gap 324 without leaking to the process furnace.

The substrate can be prevented from being contaminated in the substrate processing apparatus, and the maintenance cycle can be extended to thereby raise the manufacturing efficiency.

In the embodiments described herein, forming the gap 322 at the upper surface of the furnace opening unit 209 has been exemplified. However, the technique described herein is not limited thereto. For example, a gap can be formed at a surface of the furnace opening cover 320 facing the upper surface of the furnace opening unit 209, and connected to the inner circumferential surface 209b of the furnace opening unit 209. Such a structure can uniformly supply an inert gas or cleaning gas between the furnace opening unit 209 and the furnace opening cover 320, thereby more efficiently suppressing the occurrence of particles.

The technique described herein is not limited to the above-described embodiments. For example, a single tube serving as the process tube has been exemplified in the embodiments. However, the embodiments are not limited thereto, but a double tube including outer and inner tubes or a triple tube may be applied.

In the embodiments described herein, two inert gas supply units are installed under the process tube 203. However, the embodiments are not limited thereto. For example, only a single inert gas supply unit may be installed. When one inert gas supply unit is installed, the inert gas supply unit is installed at a side facing the exhaust pipe 231. Thus, a smooth flow path can be formed in the entire gas supply and exhaust structure.

The technique described herein can be applied to a semiconductor manufacturing technique, or particularly a heat treatment technique for performing a process in a state where a substrate is housed in a process chamber and heated by a heater. The technique described herein can be applied to a substrate processing apparatus which is used for performing various processes on a semiconductor wafer for manufacturing a semiconductor integrated circuit device (semiconductor device), the various processes including an oxidation process, a diffusion process, a reflow or annealing process for activating or flattening a carrier after ion implantation, and a film forming process through thermal CVD reaction.

<Preferred Embodiments>

Hereinafter, preferred embodiments described herein are supplementarily noted.

<Supplementary Note 1>

According to an embodiment, a method for manufacturing a semiconductor device includes: a substrate housing step of housing a substrate into a reaction tube having a furnace opening unit installed thereunder, the furnace opening unit having a trench and communication path formed at an upper surface thereof, the communication path connecting the trench to an inner circumferential surface of the furnace opening unit; and a substrate processing step of processing the substrate by supplying a process gas onto the substrate housed in the reaction tube through a process gas supply unit. At the substrate processing step, an inert gas is supplied into a space between a furnace opening cover and the furnace opening unit through an inert gas supply unit connected to the furnace opening unit, the furnace opening cover covering the trench, the communication path, and at least the inner circumferential surface of the furnace opening unit.

According to the technique described herein, it is possible to suppress the occurrence of particles.

What is claimed is:

1. A reaction container comprising:
   a furnace opening unit formed at a bottom portion of the reaction container and comprising an upper surface, an inner circumferential surface with inward projections and a lower surface; and
   a furnace opening cover comprising a plurality of cover members installed along a circumferential direction of the inner circumferential surface of the furnace opening unit whereon a lower end of the reaction container is connected and wherethrough a substrate retainer is loaded and unloaded, each of the cover members comprising:
      a vertical side portion running along a corresponding part of the inner circumferential surfaced,
      a horizontal portion extending in a horizontal direction from an upper end of the side portion,
      two openings formed on the side portion at a same height and hooked to corresponding two of the projections disposed on the inner circumferential surface, and
      a protrusion protruding toward the inner circumferential surface and interposed between the two openings located left and right of the protrusion, respectively, on the side portion so as to contact with the inner circumferential surface without being fixed to the inner circumferential surface,
   wherein a gap is formed between the side portion and the inner circumferential surface of the furnace opening unit in a state where the two openings are hooked respectively to the two of the projections disposed on the inner circumferential surface and the protrusion is in contact with the inner circumferential surface.

2. The reaction container of claim 1, wherein the plurality of cover members have sizes different from each other.

3. The reaction container of claim 2, wherein the cover members are formed of quartz.

4. The reaction container of claim 1, wherein the horizontal portion extends in a direction opposite to the protrusion, and each of the cover members makes contact with the furnace opening unit only at the two openings and the protrusion.

5. The reaction container of claim 4, wherein the protrusion is located at a height lower than heights of the two openings.

6. The reaction container of claim 1, wherein the horizontal portion protrudes outward about 1-2 mm.

7. The reaction container of claim 1, wherein the side portion has a height greater than a height of the upper surface of the furnace opening unit in a state where the cover members are installed.

* * * * *